United States Patent [19]

Tago

[11] Patent Number: 5,376,836
[45] Date of Patent: Dec. 27, 1994

[54] ECL LATCH CIRCUIT WITH SECOND CURRENT PATH FOR RESET MEANS

[75] Inventor: Shusei Tago, Tokyo, Japan

[73] Assignee: NEC Corporation, Tokyo, Japan

[21] Appl. No.: 17,107

[22] Filed: Feb. 12, 1993

[30] Foreign Application Priority Data

Feb. 12, 1992 [JP] Japan .................................. 4-024934

[51] Int. Cl.⁵ ........................................... H03K 3/286
[52] U.S. Cl. .................................... 327/215; 327/199; 326/126
[58] Field of Search .................. 307/272.2, 272.3, 291, 307/355, 494, 572, 455, 272.1

[56] References Cited

U.S. PATENT DOCUMENTS 5,155,383  10/1992  Barbera ............................. 307/272.3

*Primary Examiner*—Timothy P. Callahan
*Assistant Examiner*—Shawn Riley

[57] ABSTRACT

A latch circuit of the present invention has first and second current paths. When a reset signal of high level is supplied to the latch circuit, a current path, through which constant current is flowing, is switched from the first current path to the second current path so that an output terminal is forced to be reset.

10 Claims, 14 Drawing Sheets

FIG. 2 PRIOR ART

| Case | R(8) | LS(6) | D(7) | Qn+1 |
|------|------|-------|------|------|
| 1 | L | L | H | H |
| 2 | L | L | L | L |
| 3 | L | H | – | Qn |
| 4 | H | – | – | L |
| 5 | L | H | – | L |
| 6 | H | L | – | L |

FIG. 7 PRIOR ART

| Case | R(8) | D(7) | C(6) | Qn+1 |
|---|---|---|---|---|
| 1 | L | L | L→H | L |
| 2 | L | H | L→H | H |
| 3 | L | – | L | Qn |
| 4 | L | – | H | Qn |
| 5 | H | – | – | L |

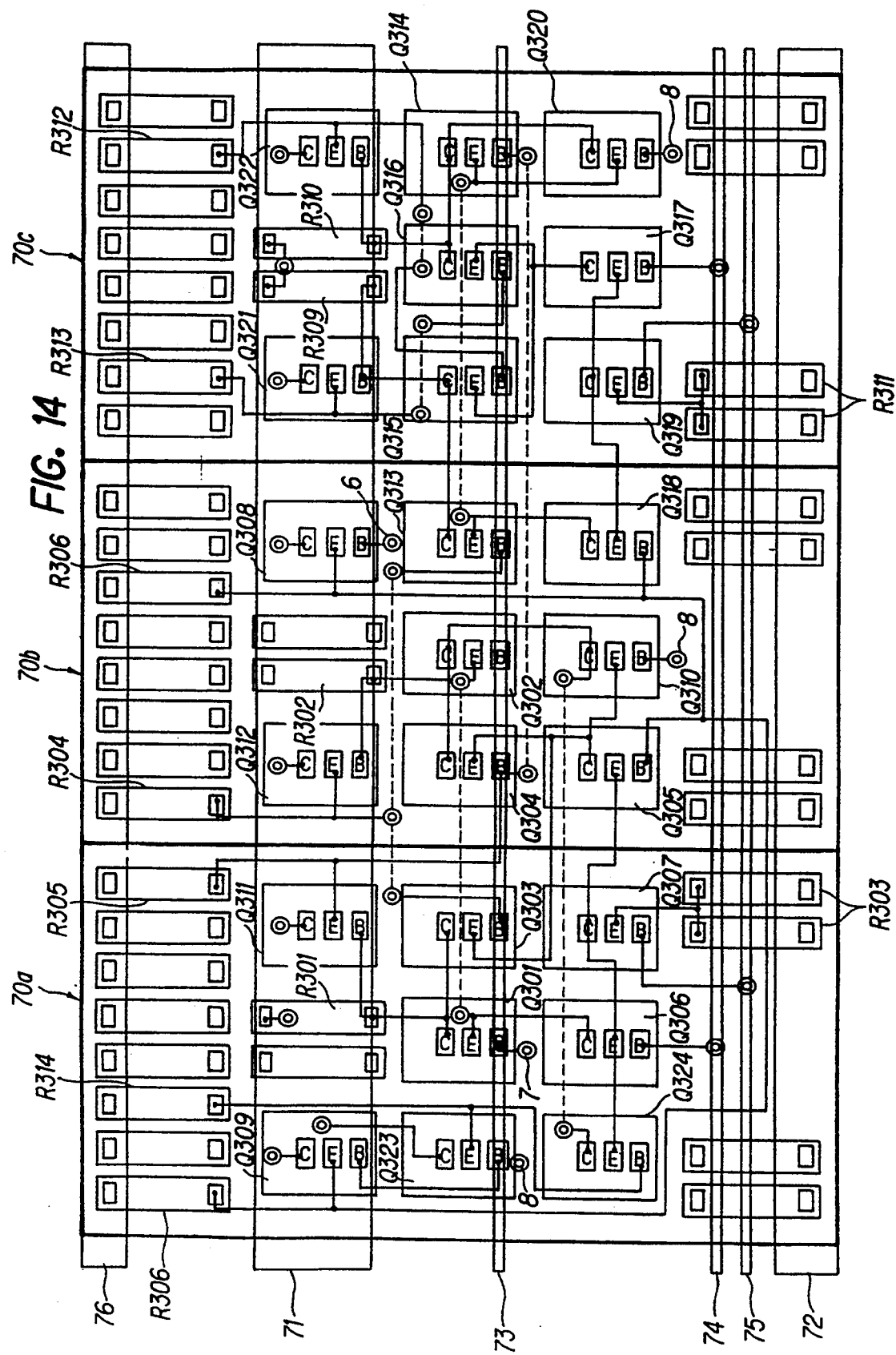

ECL LATCH CIRCUIT WITH SECOND CURRENT PATH FOR RESET MEANS

FIELD OF THE INVENTION

This invention relates to a latch circuit, and more particularly, to a latch circuit made as a master-slice type LSI.

BACKGROUND OF THE INVENTION

As recent improvement of LSI (large scale integration), a master-slice type LSI has been used in order to easily respond to the variety of consumer's needs.

In fabrication of a master-slice LSI, a plurality of unit cells each having semiconductor devices required for forming predetermined logic circuits are mounted on a semiconductor substrate to form a general-purpose substrate. Then, the semiconductor devices on the general-purpose substrate are connected to each other to form a desired internal cell portion. Then, input-output terminal portions and external terminal connectors are formed around the internal cell portion.

A conventional latch circuit includes a plurality of transistors, a plurality of general resistors, two level-shift resistors, a data input terminal to which an input data is supplied, an output terminal, a strobe signal terminal, and a reset signal terminal.

In the conventional latch circuit, a level of the output terminal is controlled in accordance with a strobe signal supplied to the strobe signal terminal, that is, the operation mode is changed between a data through mode and a latch mode. When a reset signal of high level is supplied to the reset terminal, the two level-shift resistors forces the output terminal to be low level state.

According to the conventional latch circuit, however, there is a disadvantage that the level-shift resistors occupy a large area on a substrate in case where the latch circuit is fabricated form a master slice LSI. Therefore, the semiconductor chip having the conventional latch circuit is large in size.

SUMMARY OF THE INVENTION

Accordingly, it is an object of the invention to provide a latch circuit which can be fabricated to provide a master slice LSI of a smaller size.

According to the invention, a latch circuit includes:
a first ECL (emitter coupled logic) circuit for supplying positive (high) and negative (low) signals in accordance with a data signal supplied thereto;
a second ECL circuit including a flip-flop circuit for shifting said positive and negative signals in level and holding the data signal by carrying out a positive feedback of the level shifted signals, and a first current path parallel to the flip-flop circuit;
a third ECL circuit for causing the first and second ECL circuits to be active by switching a drive current path to be supplied to the first and second ECL circuits in accordance with a strobe signal supplied thereto to control admitting and holding the data signal;
first switching means for switching the drive current from the second ECL circuit to the first ECL circuit in accordance with a control signal;
a second current path connected between the second and third ECL circuits; and
second switching means for supplying, in accordance with the control signal, part of the drive current flowing through the first current path to the second current path.

The other objects and features of the invention will become understood from the following description with reference to the accompanying drawings.

BRIEF DESCRIPTION OF THE DRAWINGS

FIG. 2 is a truth table showing operation of the conventional latch circuit;

FIG. 7 is a truth table showing operation of the conventional master-slave D flip-flop circuit;

FIG. 14 is a plan view showing a master slice type LSI pattern of the second preferred embodiment shown in FIG. 12.

DESCRIPTION OF THE PREFERRED EMBODIMENTS

For better understanding of the background of the present invention, the basic principle of the conventional technology is first described hereinafter with reference to FIGS. 1 to 8.

Figure 1:
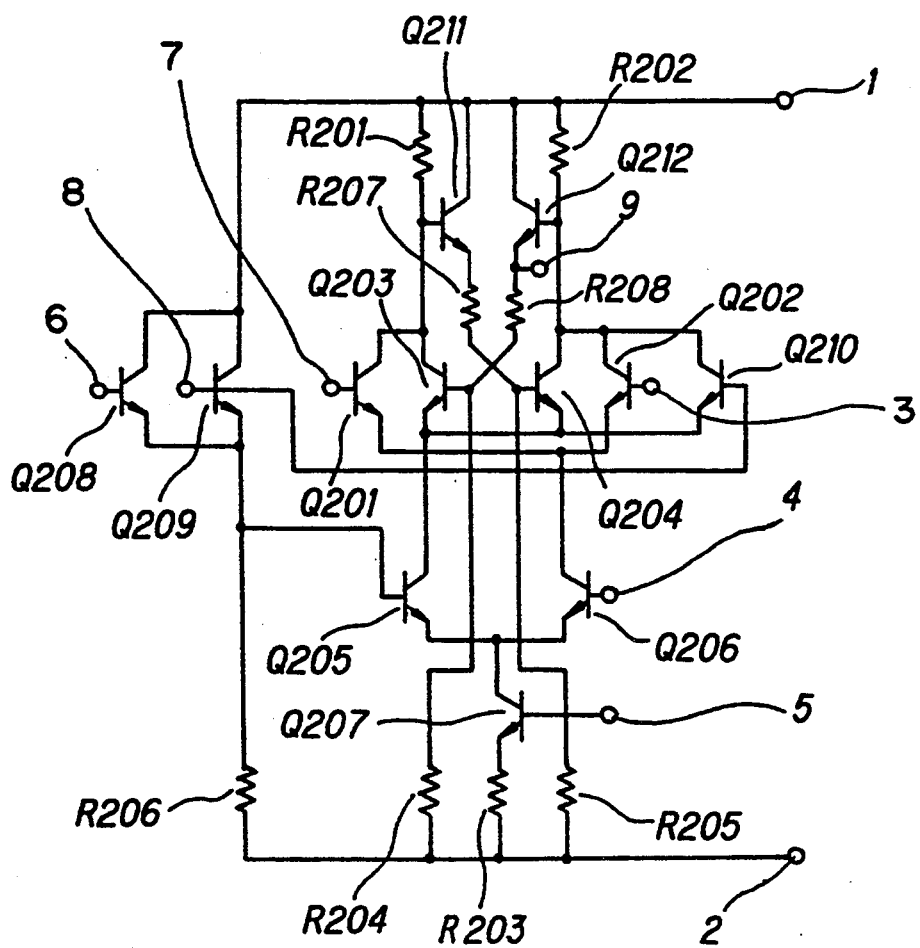
FIG. 1 is a circuit diagram illustrating a conventional latch circuit.

FIG. 1 shows a conventional latch circuit. The latch circuit includes twelve transistors Q201 to Q212, six general resistors R201 to R206, two level-shift resistors R207 and R208, first and second power supply terminals 1 and 2, first, second and third reference voltage terminals 3, 4, and 5, a strobe signal terminal 6, a data signal terminal 7, a reset signal terminal 8, and an output terminal 9.

The transistor Q201 is connected at a base to the data signal terminal 7, at a collector through the resistor R201 to the first power supply terminal 1 and at an emitter to a collector of the transistor Q206. The transistor Q202 is connected at a base to the first reference voltage terminal 3, at a collector, through the resistor R202 to the first power supply terminal 1 and at an emitter to the collector of the transistor Q206. The transistors Q201 and Q202 form a differential logic circuit for an input data signal.

The transistor Q203 is connected at a collector through the resistor R201 to the first power supply terminal 1 and at emitter to a collector of the transistor Q205. The transistor Q204 is connected at a collector through the resistor R202 to the first power supply terminal 1 and at an emitter to the collector of the transistor Q205. The transistor Q203 is applied at the base with a voltage at the collector of the transistor Q202 through the transistor Q212 and the resistor R208. The transistor Q204 is applied at the base with a voltage at the collector of the Q201 through the transistor Q211 and the resistor R207. Therefore, a differential logic circuit is formed by the structure.

The transistor Q205 is connected at its base to an emitter of the emitter follower transistor Q208, to which a strobe signal is supplied and transistor Q206 is connected at its base to the second reference voltage terminal 4 Transistors Q205 and Q206 are connected at emitters commonly to a collector of the transistor Q207 used for a constant current source. The transistors Q205 and Q206 form a differential logic circuit for switching an operation mode of the latch circuit in accordance with the strobe signal.

The transistor Q209 is connected at a base to the reset signal terminal 8, at a collector to the first power supply terminal 1 and at an emitter to the emitter of the transistor Q208.

The transistor Q210 is connected at a base to the reset signal terminal 8 and at a collector and an emitter to the collector and the emitter of the transistor Q204, respectively.

Next, operation of the conventional latch circuit will be explained in conjunction with a truth table shown in FIG. 2.

When both of the strobe signal terminal 6 and the reset signal terminal 8 are low, the transistor Q205 is turned off and the transistor Q206 is turned on. At this time, a data-through circuit is formed between the data signal terminal 7 and the output terminal 9 by the differential logic circuit composed of the transistors Q201 and Q202. As a result, the latch circuit is in the data through mode by the strobe signal of low level. That is, when the data signal input terminal 7 is high, the transistor Q201 is turned on and the transistor Q202 is turned off. Thus, constant current "I" generated by the transistor Q207 and the resistor R203 flows through a path of the resistor R201 and the transistors Q201 and Q206, and voltage at the power supply terminal 1 is applied to the base of the transistor Q212, so that the output terminal 9 becomes high (case 1).

On the other hand, when the data signal terminal 7 is low, the transistor Q201 is turned off and the transistor Q202 is turned on. Thus, the constant current "I" flows through a path of the resistor R202 and the transistors Q202 and Q206, and the voltage level at the base of the transistor Q212 falls to lower than that in the case 1, so that the output terminal 9 becomes low (case 2).

Next, when the strobe signal terminal 6 becomes high, the transistor Q205 is turned on and the transistor Q206 is turned off. Therefore, the state of the output terminal 9, that is, a rout of the constant current "I" depends on voltage levels at the bases of the transistors Q210, Q203 and Q204.

As mentioned above, voltage levels of the transistors Q203 and Q204 correspond to the voltage levels at the collectors of the transistors Q202 and Q201. Therefore, when the reset signal terminal 8 is low, current flowing through the resistor R201 or R202, that is, a level at the output terminal 9 is latched to be the preceding state "Qn" which is a state before the strobe signal terminal 6 becomes high (case 3).

In the latched condition, when the reset signal terminal 8 becomes high, the transistor Q210 is turned on, so that voltage levels at the bases of the transistors Q203 and Q204 are shifted down due to the voltage drop at the resistors R208 and R207. For this reason, the transistors Q203 and Q204 are turned off, so that the constant current "I" flows through a path formed by the resistor R202 and the transistors Q210 and Q205. As a result, the output terminal 9 is forced to become low (case 4).

After that, even if the reset signal terminal 8 becomes low (case 5) the output terminal 9 is latched to be low level by turning on the transistors Q203 and Q204 as long as the strobe signal terminal 6 is high.

When the reset signal terminal 8 becomes high, the transistor Q209 is turned on even if the strobe signal terminal 6 is low. As a result, the strobe signal terminal 6 is in a state corresponding to the high level, so that the output terminal 9 becomes low independently of the state of the data signal terminal 7 (case 6).

In such circuit structure, each of the resistors R207 and R208 is designed to have logic amplitude of one third to one fourth of the above mentioned level shift voltage in order to lower the base voltage of the transistors Q203 and Q204 to a predetermined level lower than that at the power supply terminal 1.

Figure 3:
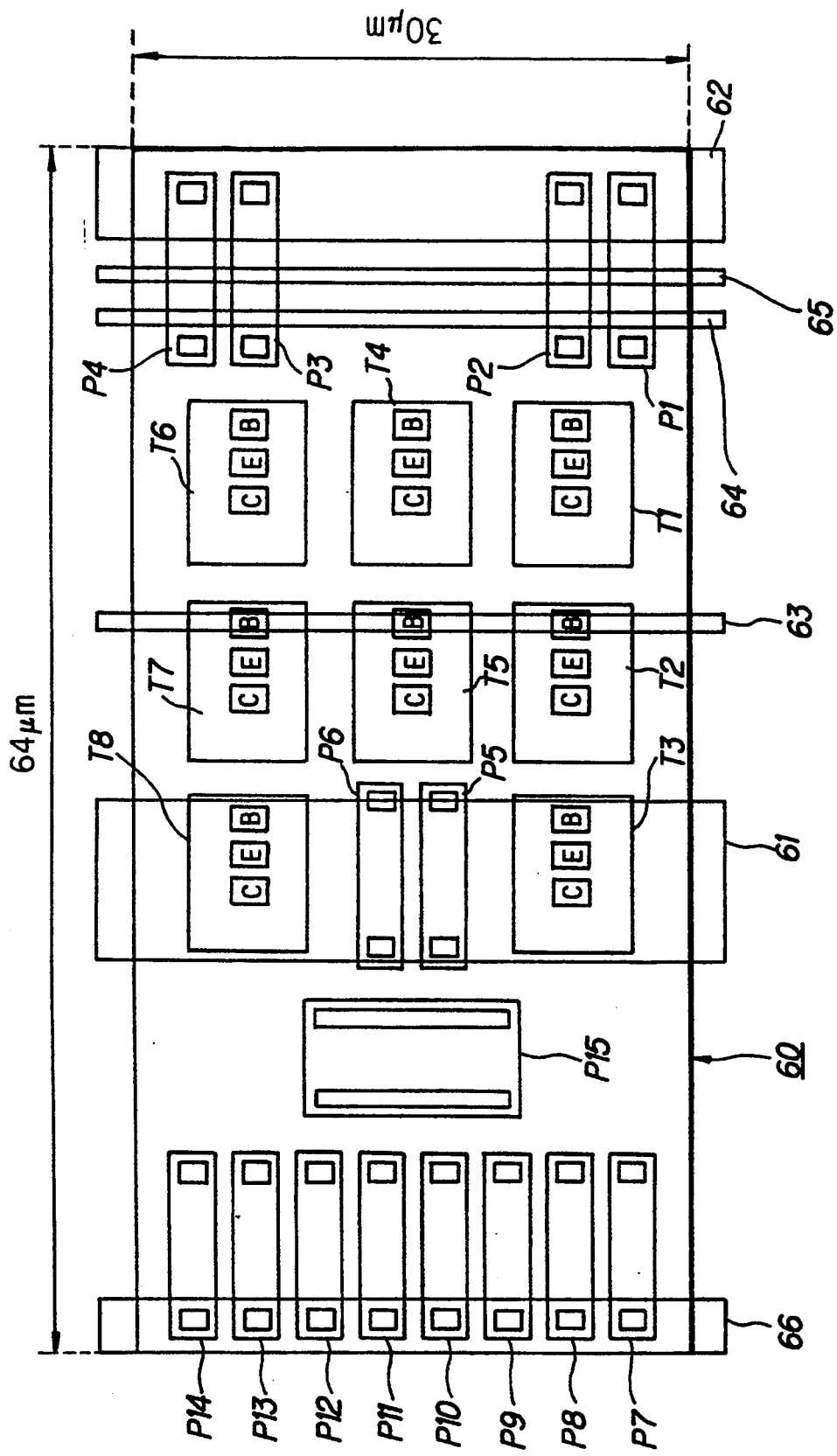
FIG. 3 is a plan view showing a unit cell pattern of the conventional latch circuit.

FIG. 3 shows a pattern of a unit cell 60 used for fabricating the latch circuit shown in FIG. 1 by the master slice method. The unit cell 60 includes eight transistors T1 to T8, fourteen general resistors P1 to P14, a level shift resistor P15, a first power supply line 61, second power supply lines 62 and 66, and first, second and third reference voltage lines 63 to 65.

Each of the transistors T1 to T8 is shaped to be square and has contact holes for a collector "C", an emitter "E" and a base "B". The transistors are located next to each other. Each of the emitters "E" of the transistors T1 to T8 has an area of 0.8 $\mu m \times 2.2$ $\mu m$. And, each of the transistors T1 to T8 occupies an area of 6.4 $\mu m \times 8.3$ $\mu m = 52$ $\mu m^2$ on the substrate.

Each of the general resistors P1 to P14 has a layer resistance of 1.3 k$\Omega$/o, a total resistance of 4 k$\Omega$, and occupies an are of 12.4 $\mu m \times 5.8$ $\mu m = 72$ $\mu m^2$. The general resistors P1 to P4 are arranged at the right side of the unit cell 60 to be connected at the thereof terminals to the second power supply line 62, and the general resistors P7 to P14 are arranged at the left side of the unit cell 60 to be connected at the thereof terminals to the second power supply line 66. The general resistors P5 and P6 are arranged between the transistors T3 and T8 to be connected at the terminals thereof to the first power supply line 61.

The level-shift resistor P15 is located near the general resistors P7 to P14. The level-shift resistor P15 has a layer resistance of 1.3 k$\Omega$/□ and a total resistance of 300 $\Omega$, and occupies area of 12.4 $\mu m \times 5.8$ $\mu m = 72$ $\mu m^2$. The level-shift resistor P15 occupies an area larger than those of the general resistors, because the total resistance is small and it is required to be fabricated with high precision. The unit cell 60 occupies an area of 64 $\mu m \times 30$ $\mu m = 1,920$ $\mu m^2$ on the substrate.

The latch circuit shown in FIG. 1 includes twelve transistors, six general resistors and two level-shift resistors, so that a master slice LSI is fabricated by using two unit cells 60.

Figure 4:
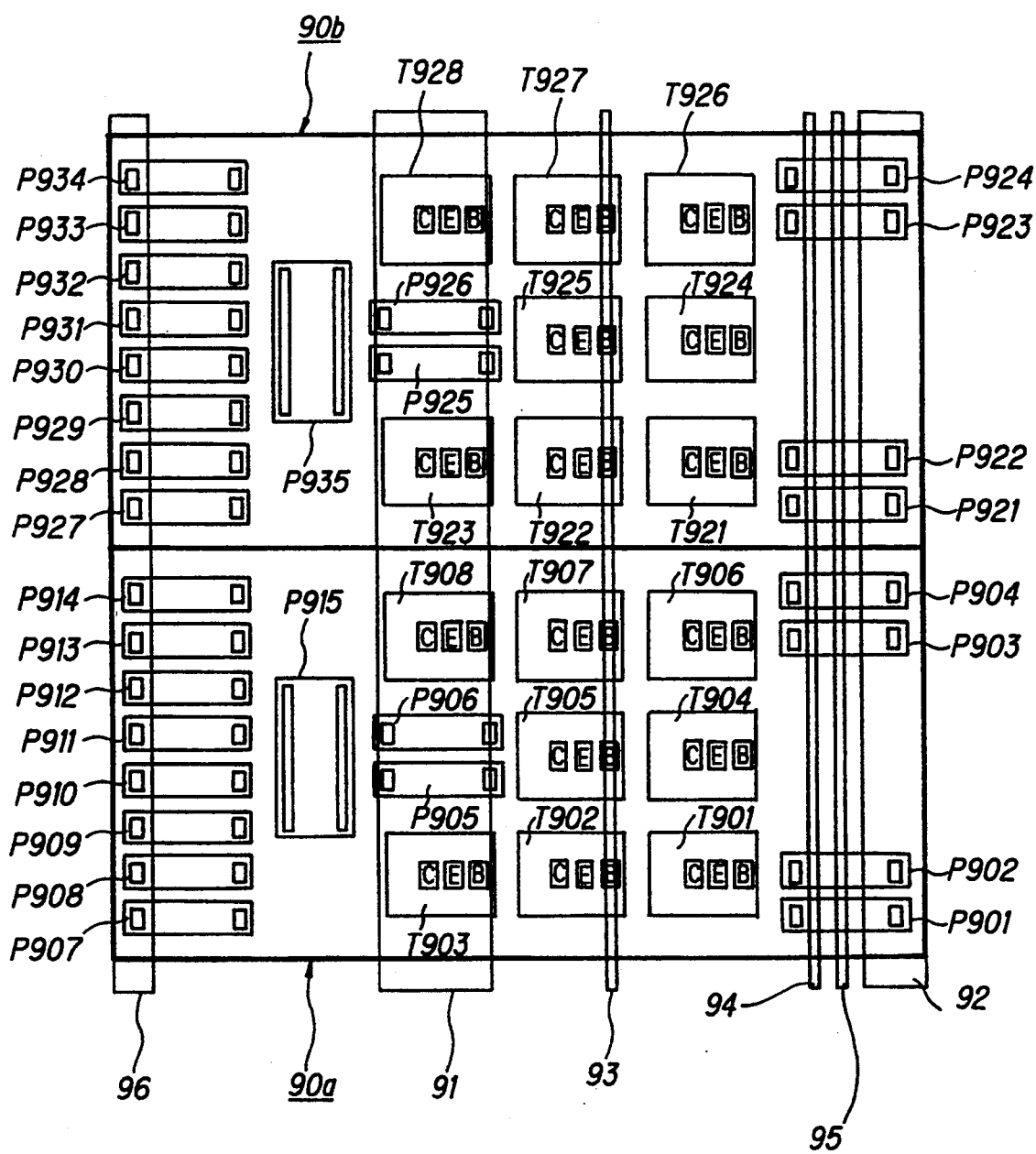
FIG. 4 is a plan view showing a general-purpose substrate pattern of the conventional latch circuit.
Figure 5:
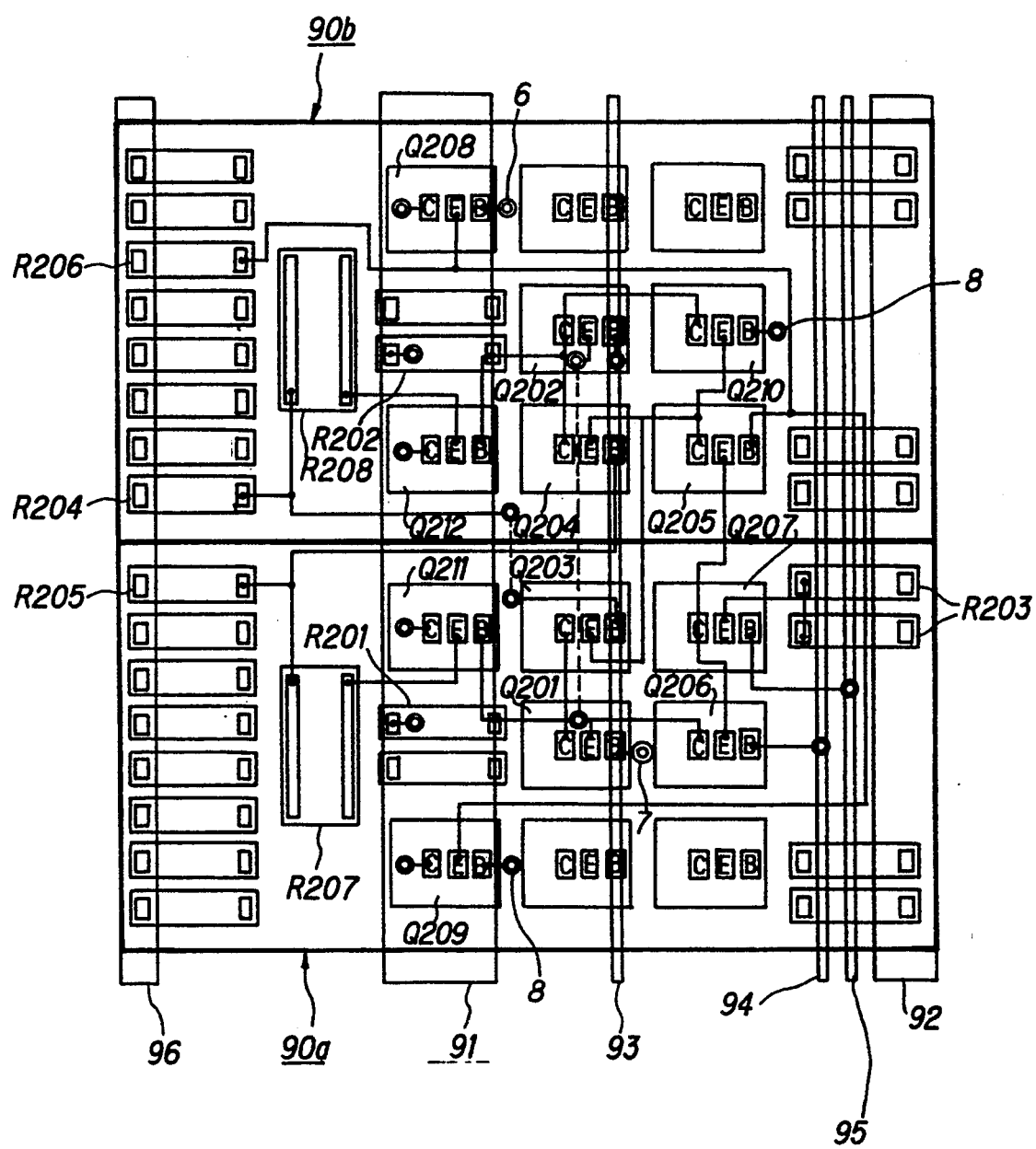
FIG. 5 is a plan view showing a master slice type LSI pattern of the conventional latch circuit shown in FIG. 1.

FIG. 4 shows a substrate using two unit cells 90a and 90b each corresponding to the unit cell 60. And, FIG. 5 shows a substrate in which the required devices are connected each other. In FIG. 5, like parts are indicated by like reference symbols as used in FIG. 1.

In FIG. 4, transistors T903, T904, T905, T906, T907 and T908 correspond to the transistors Q209, Q206 Q201, Q207, Q203 and Q211 FIG. 1, respectively. A pair of general resistors P903 and P904, which are connected in parallel each other, correspond to the resistor R203. General resistors P914 and P906 correspond to the resistors R205 and R201, respectively. The level-shift resistor R207 corresponds to a level-shift resistor P915.

The transistors Q205, Q204 Q212, Q210, Q202 and Q208 of FIG. 1 correspond to transitors T921, T922, T923, T924, T925 and T928 of FIG. 4, respectively. The general resistors R204 and R202 correspond to resistors P927 and P925, and the level-shift resistor R208 corresponds to a resistor P935, respectively.

The conventional latch circuit occupies an area of $1,920 \times 2 = 3,840$ ($\mu m^2$) on the substrate.

Figure 6:
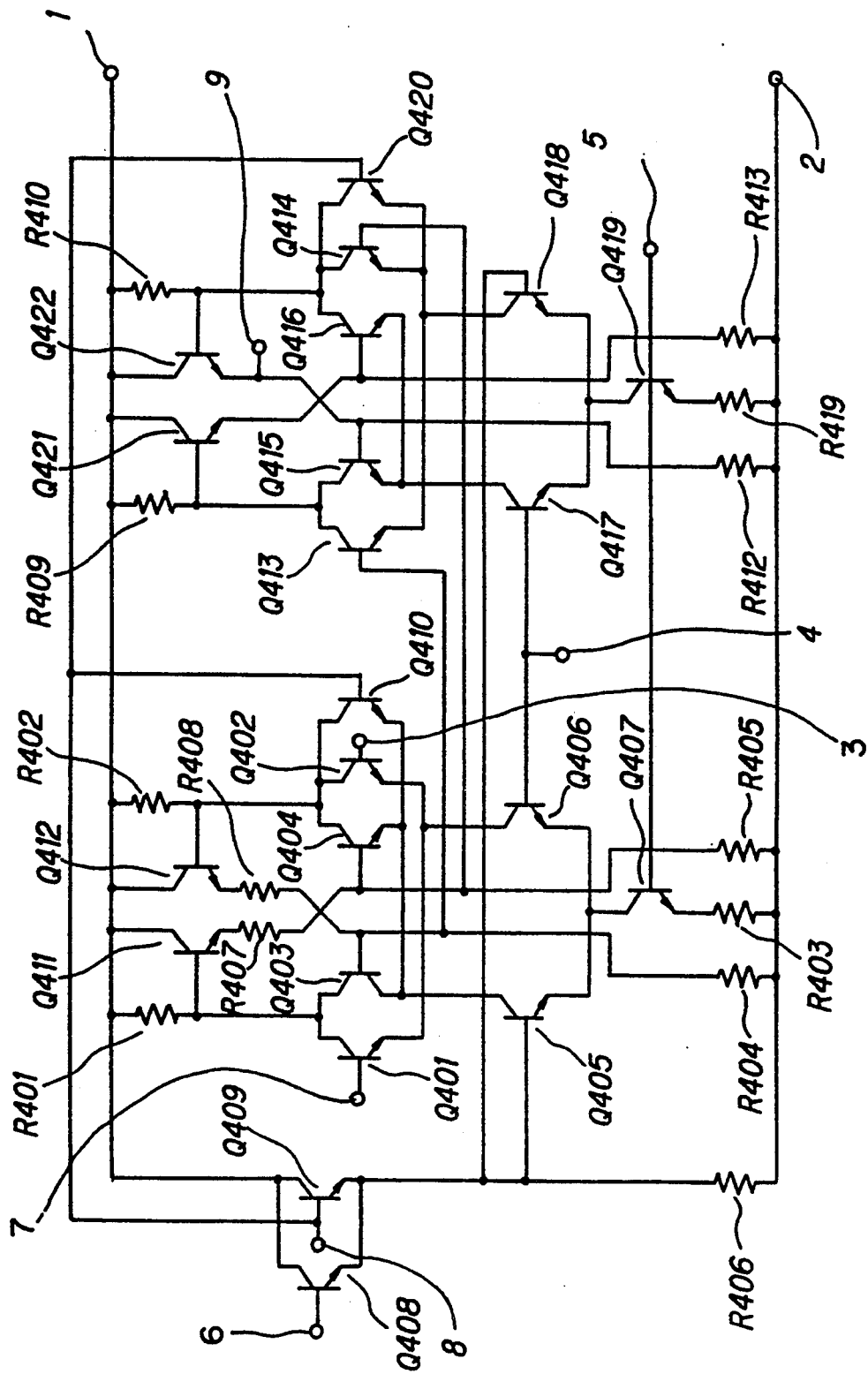
FIG. 6 is a circuit diagram illustrating a conventional master-slave D flip-flop circuit.

FIG. 6 shows a conventional master-slave type D flip-flop circuit using the latch circuit shown in FIG. 1 at the master side. This circuit includes twenty-two transistors Q401 to Q422, eleven general resistors R401 to R407, R409, R410, R412, R413 and R419 and two level-shift resistors R407 and R408.

The flip-flop circuit operates in accordance with a truth table shown in FIG. 7.

Figure 8:
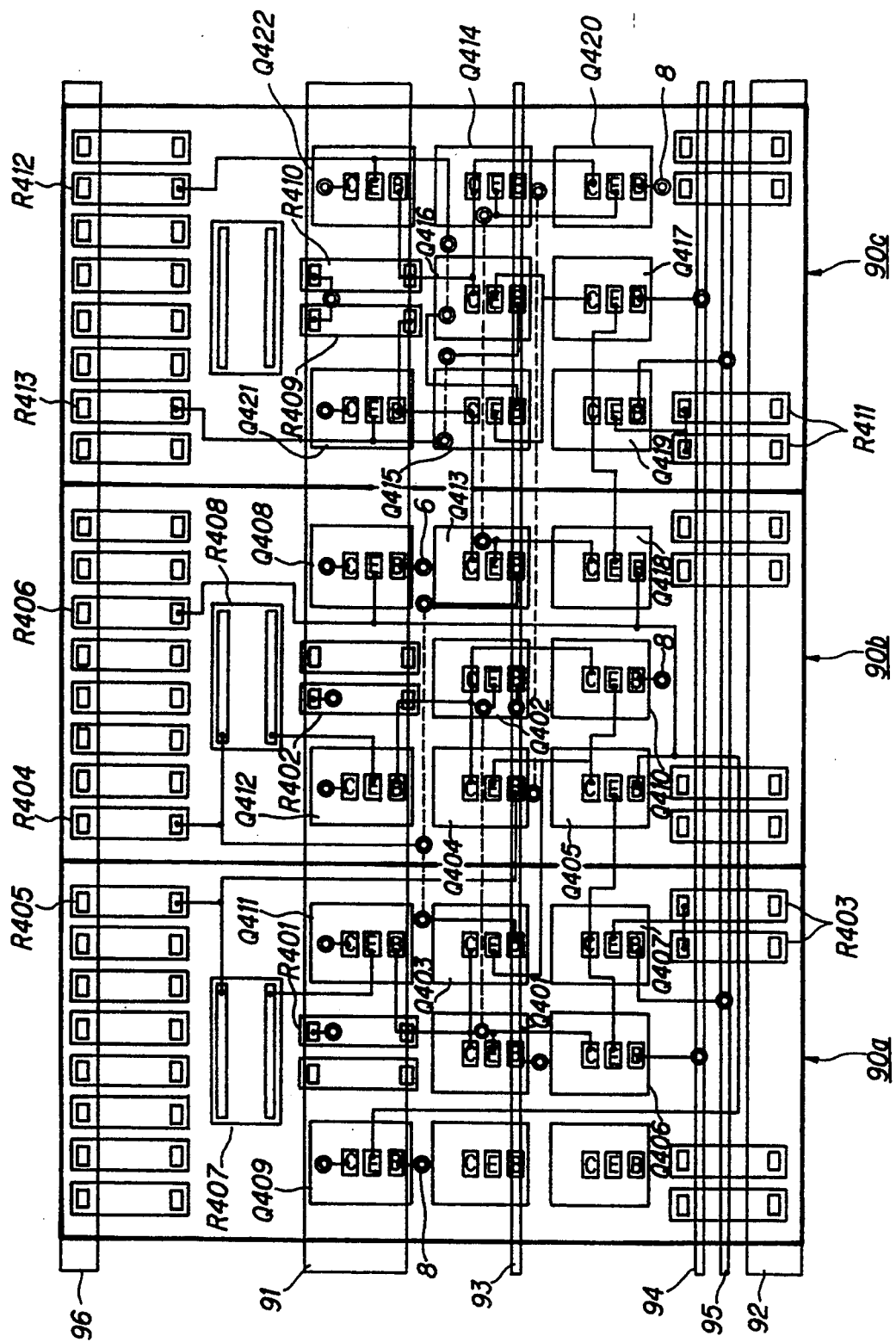
FIG. 8 is a plan view showing a master slice type LSI for the conventional master-slave D flip-flop circuit shown in FIG. 6.

The flip-flop circuit is fabricated as a master slice LSI using three of the unit cells 60 shown in FIG. 3. FIG. 8 shows a substrate pattern for fabricating the flip-flop circuit, in which three unit cells 90a, 90b and 90c each corresponding to the unit cell 60 are used.

According to the conventional latch circuit shown FIG. 1, however, there is a disadvantage in that the level-shift resistors R207 and R208 occupy large area on the substrate in case where the latch circuit is fabricated as a master slice LSI.

Therefore, the semiconductor chip having the conventional latch circuit is large in size.

Figure 9:
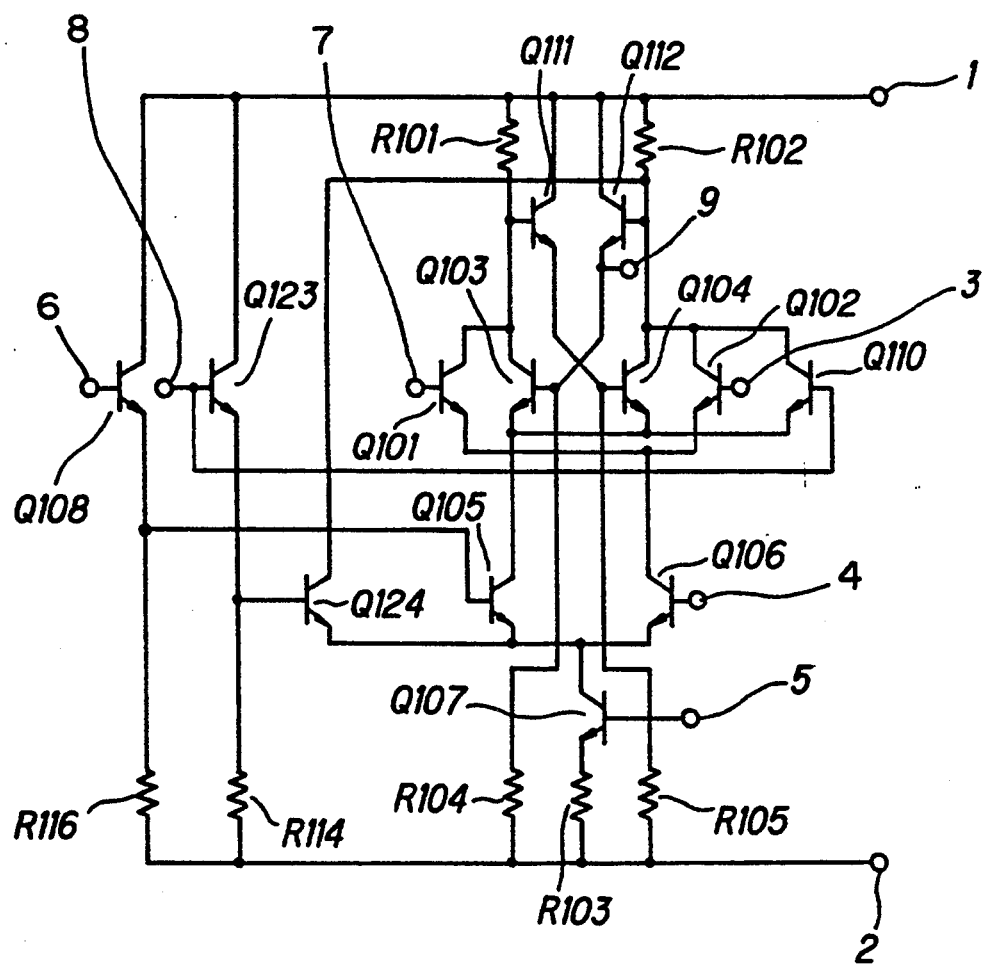
FIG. 9 is a circuit diagram illustrating a latch circuit of a first preferred embodiment according to the invention.

FIG. 9 shows a latch circuit of a first preferred embodiment according to the invention. The latch circuit includes thirteen transistors Q101 to Q108, Q110 to Q112, Q123 and Q124, seven general resistors R101 to R105, R114 and R116, first and second power supply terminals 1 and 2, first, second and third reference voltage terminals 3, 4 and 5, a strobe signal terminal 6, a data signal terminal 7, a reset signal terminal 8 and an output terminal 9. That is, the latch circuit of this embodiment is structured by excluding the transistor Q209 and the level-shift resistors R207 and R208 from the conventional latch circuit shown in FIG. 1, and adding the transistors Q123 and Q124 and the resistor R114 thereto.

The transistor Q101 is connected at a base to the data signal terminal 7, at a collector through the resistor R101 to the first power supply terminal 1 and at an emitter to a collector of the transistor Q106. The transistor Q102 is connected at a base to the first reference voltage terminal 3, at a collector through the resistor R102 to the first power supply terminal 1 and at an emitter to the collector of the transistor Q106. The transistors Q101 and Q102 form a differential logic circuit (first ECL circuit) for an input data signal.

The transistor Q103 is connected at a collector through the resistor R101 to the first power supply terminal 1 and at an emitter to a collector of the transistor Q105. The transistor Q104 is connected at a collector through the resistor R102 to the first power supply terminal 1 and at an emitter to the collector of the transistor Q105. The transistor Q103 is applied at the base with a voltage applied to the collector of the transistor Q102 through the transistor Q112, which is connected at an emitter to the output terminal 9. The transistor Q104 is applied at the base with a voltage applied to the collector of the Q101 through this transistor Q111. By the structure, a differential logic circuit (second ECL circuit) for latching a data signal is formed.

The transistor Q105 and is connected at its base to an emitter of the emitter follower transistor Q108, which is supplied with a strobe signal, and transistor Q106 is connected at its base to the second reference voltage terminal 4. Transistors Q105 and Q106 are connected and at their emitters commonly to a collector of the transistor Q107 used for generating constant current. The transistors Q105 and Q106 form a differential logic circuit for switching an operation mode of the latch circuit in accordance with a strobe signal.

The transistor Q110 is connected at a base thereof to the reset signal terminal 8 and at a collector thereof to the collector of transistor Q104; and at an emitter thereof to the emitter of the transistor Q104.

The transistor Q123 is connected at a base to the reset signal terminal 8, at a collector to the first power supply terminal 1 and at an emitter through the resistor R114 to the second power supply terminal 2. The transistor Q124 is connected at a base to the emitter of the transistor Q123, at a collector to the collector of the transistor Q104 and at an emitter to the emitter of the transistor Q105.

In the latch circuit, the transistors Q101 to Q112 operate in the same manner as the transistors Q201 to Q208 and Q210 to Q212 in the conventional latch circuit shown in FIG. 1. Further, the resistors R101 to R105 operate in the same manner as the resistors R201 to R205.

Next, operation of the latch circuit will be explained in conjunction with the truth table shown in FIG. 2, which may be adapted to not only the conventional latch circuit but also the latch circuit of the invention.

When the reset signal terminal 8 is low, the transistor Q124 is invariably off. Therefore, the latch circuit operates in the same manner as the conventional latch circuit shown in FIG. 1 as to condition of the strobe signal terminal 6 and the data signal terminal 7.

That is, when both of the strobe signal terminal 6 and the reset signal terminal 8 are low, the transistor Q105 is turned off and the transistor Q106 is turned on. At this time, a data-through circuit is formed between the data signal terminal 7 and the output terminal 9 by the differential logic circuit (the first ECL circuit) composed of the transistors Q101 and Q102.

As a result, the latch circuit is in the data through mode by the strobe signal of low level. That is, when the data signal input terminal 7 is high, the transistor Q101 is turned on and the transistor Q102 is turned off. Thus, constant current "I" generated by the transistor Q107 and the resistor R103 flows through a path formed by the resistor R101 and the transistors Q101 and Q106, and voltage at the power supply terminal 1 is applied to the base of the transistor Q112, so that the output terminal 9 becomes high (case 1).

On the other hand, when the data signal terminal 7 is low, the transistor Q101 is turned off and the transistor Q102 is turned on. Thus, the constant current "I" flows through a path formed by the resistor R102 and the transistors Q102 and Q106, and the voltage applied to the base of the transistor Q112 falls lower than that in case 1, so that the output terminal 9 becomes low (case 2).

Next, when the strobe signal terminal 6 becomes high from the above mentioned condition, the transistor Q105 is turned on and the transistor Q106 is turned off. Therefore, the state of the output terminal 9, that is, a rout of the constant current "I" now depends on voltage levels at the bases of the transistors Q110, Q103 and Q104.

As mentioned above, voltage levels of the transistors Q103 and Q104 correspond to the voltage levels at the collectors of the transistors Q102 and Q101. Therefore, when the reset signal terminal 8 is low, current flowing through the resistor R101 or R102 is held, so that the output terminal 9 is latched to be the preceding state "Qn" which is a state before the strobe signal terminal 6 becomes high (case 3). In this condition, the state of the output at terminal 9 does not change even though the state of the data signal terminal 7 changes.

When the strobe signal terminal 6 is high and the output signal at terminal 9 is latched to be high, the constant current "I" flows through a path formed by the resistor R101 and the transistors Q103 and Q105, so that a voltage at the base of the transistor Q103 becomes high and a voltage at the base of the transistor Q104 becomes low.

In this condition, when the reset signal terminal 8 becomes high, the transistor Q124 is turned on, so that part of the constant current "I" is branched and flows through the transistor Q124 and the resistor R102. As a result, voltage level at the base of the transistor Q103 is shifted down due to the voltage drop at the resistor R102. Therefore, the transistor Q103 is turned off.

At this time, the transistor Q110 is turned on due to the high level state at the base thereof, so that the constant current "I" flows through a path formed by the transistors Q124, Q105 and Q110 and the resistor R102. As a result, the output terminal 9 is forced to become low (case 4). At this time, level at the base of the transistor Q104 is high.

In this condition, when the reset signal terminal 8 becomes low, the transistor Q124 is turned off, so that the constant current "I" flows through a path formed by the transistors Q105 and Q104 and the resistor R102 to latch the output terminal 9 to be low (case 5).

When the strobe signal terminal 6 is low and the reset signal terminal 8 is high, the constant current "I" flows through a path of the transistor Q124 and the resistor R102. As a result, the output terminal 9 is still latched to be low (case 6).

Figure 10:
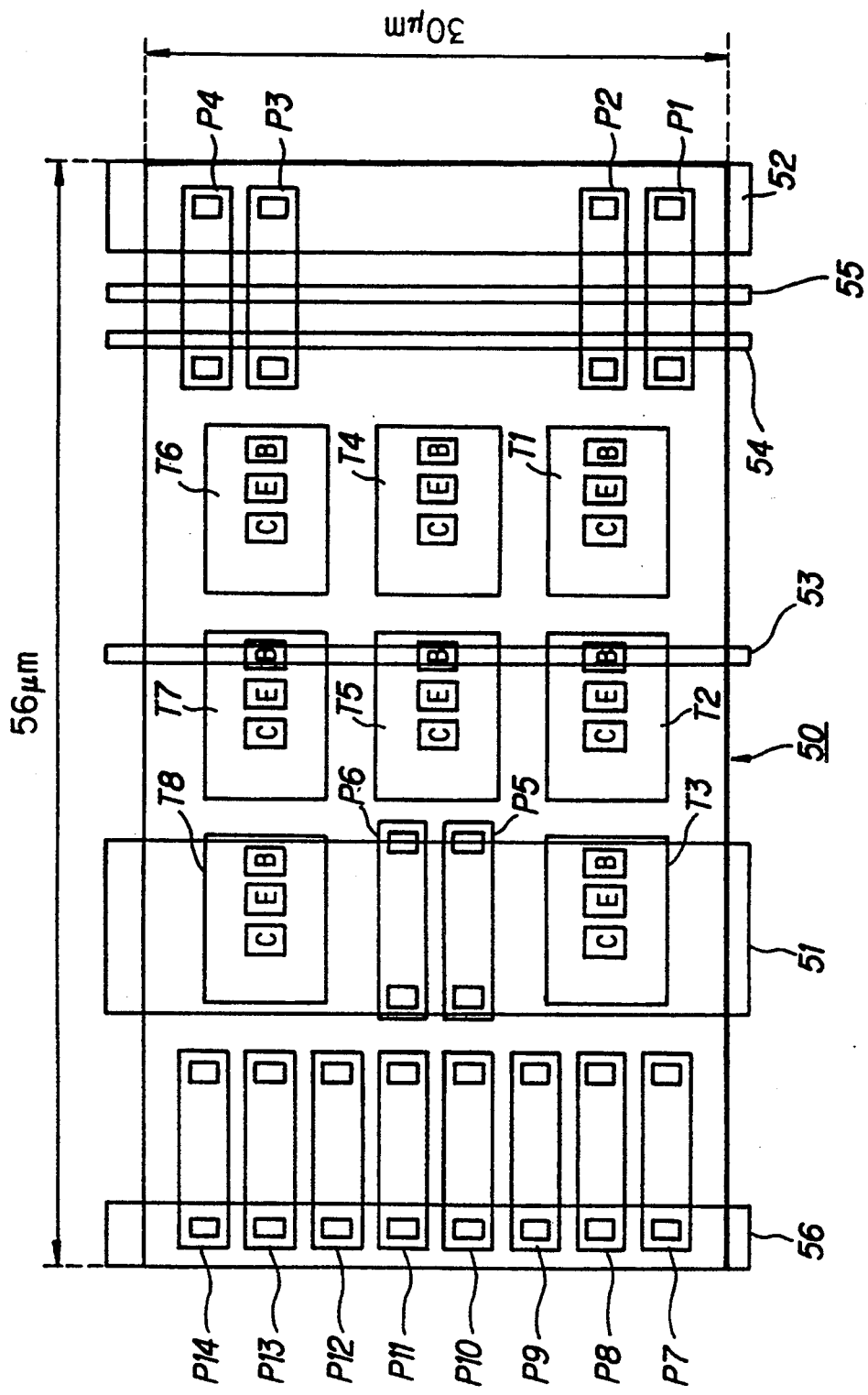
FIG. 10 is a plan view showing a unit cell pattern of the first preferred embodiment.

FIG. 10 shows a pattern of a unit cell 50 used for fabricating the latch circuit shown in FIG. 9 by the master slice method. The unit cell 50 includes eight transistors T1 to T8, fourteen general resistors P1 to P14, a first power supply line 51, second power supply lines 52 and 56 and first, second and third reference voltage lines 53 to 55.

Each of the transistors T1 to T8 is square shaped and has contact holes for a collector "C", an emitter "E" and a base "B". The transistors are located next to each other. Each of the emitters "E" of the transistors T1 to T8 has an area of 0.8 μm×2.2 μm. And, each of the transistors T1 to T8 occupies an area of 6.4 μm×8.3 μm=52 μm² on a substrate.

Each of the general resistors P1 to P14 has a layer resistance of 1.3 kΩ/□, a total resistance of 4 kΩ, and occupies an area of 12.4 μm×5.8 μm=72 μm². The general resistors P1 to P4 are arranged at the right side of the unit cell 50 to be connected at the terminals thereof to the second power supply line 52, and the general resistors P7 to P14 are arranged at the left side of the unit cell 50 to be connected at the terminals thereof to the second power supply line 56. The general resistors P5 and P6 are arranged between the transistors T3 and T8 to be connected at the terminals thereof to the first power supply line 51.

As mentioned above, the latch circuit shown in FIG. 9 includes thirteen transistors and seven general resistors, so that a master slice LSI is fabricated by using two of the unit cell 50.

Figure 11:
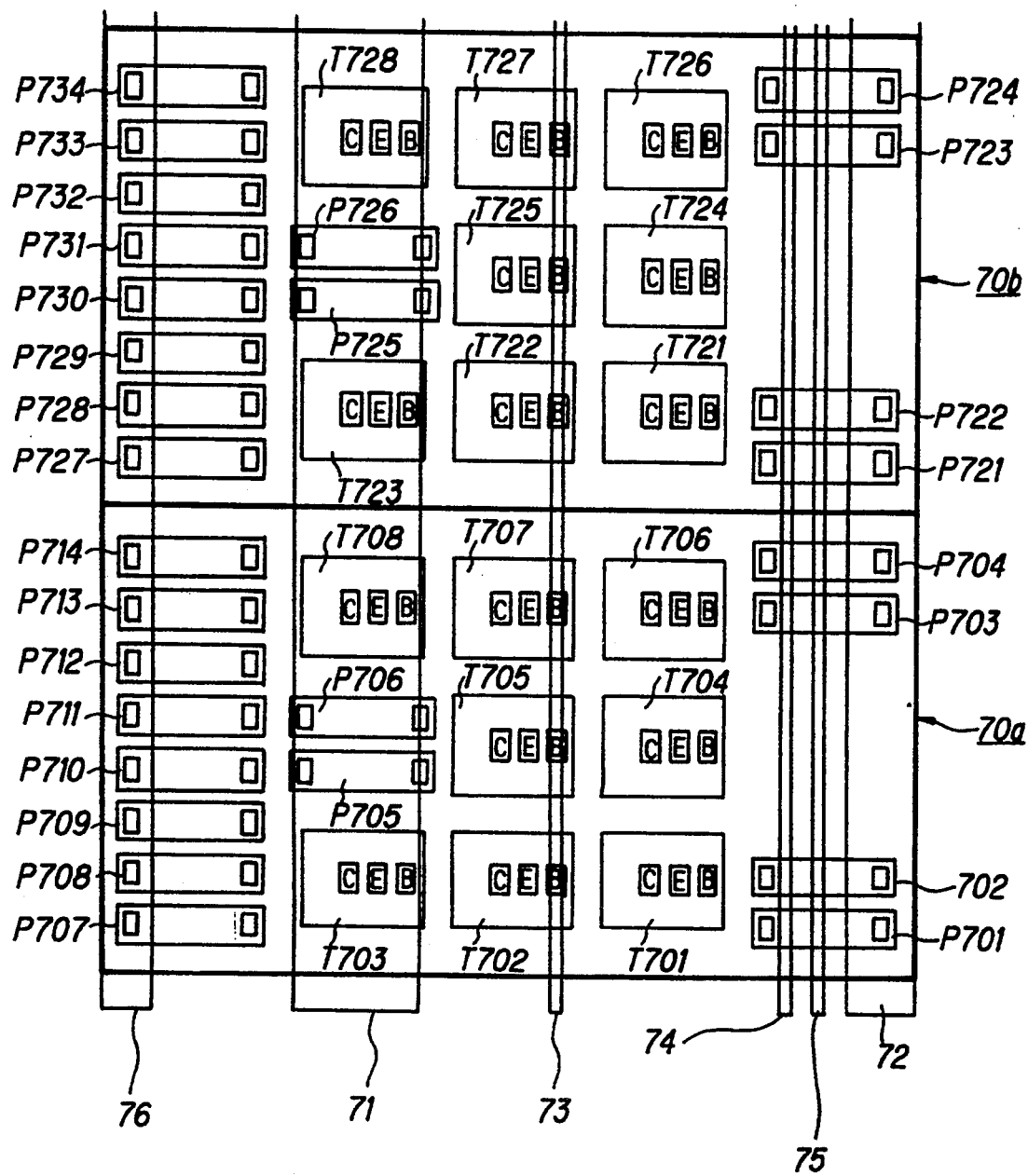
FIG. 11 is a plan view showing a general-purpose substrate pattern of the first preferred embodiment.
Figure 12:
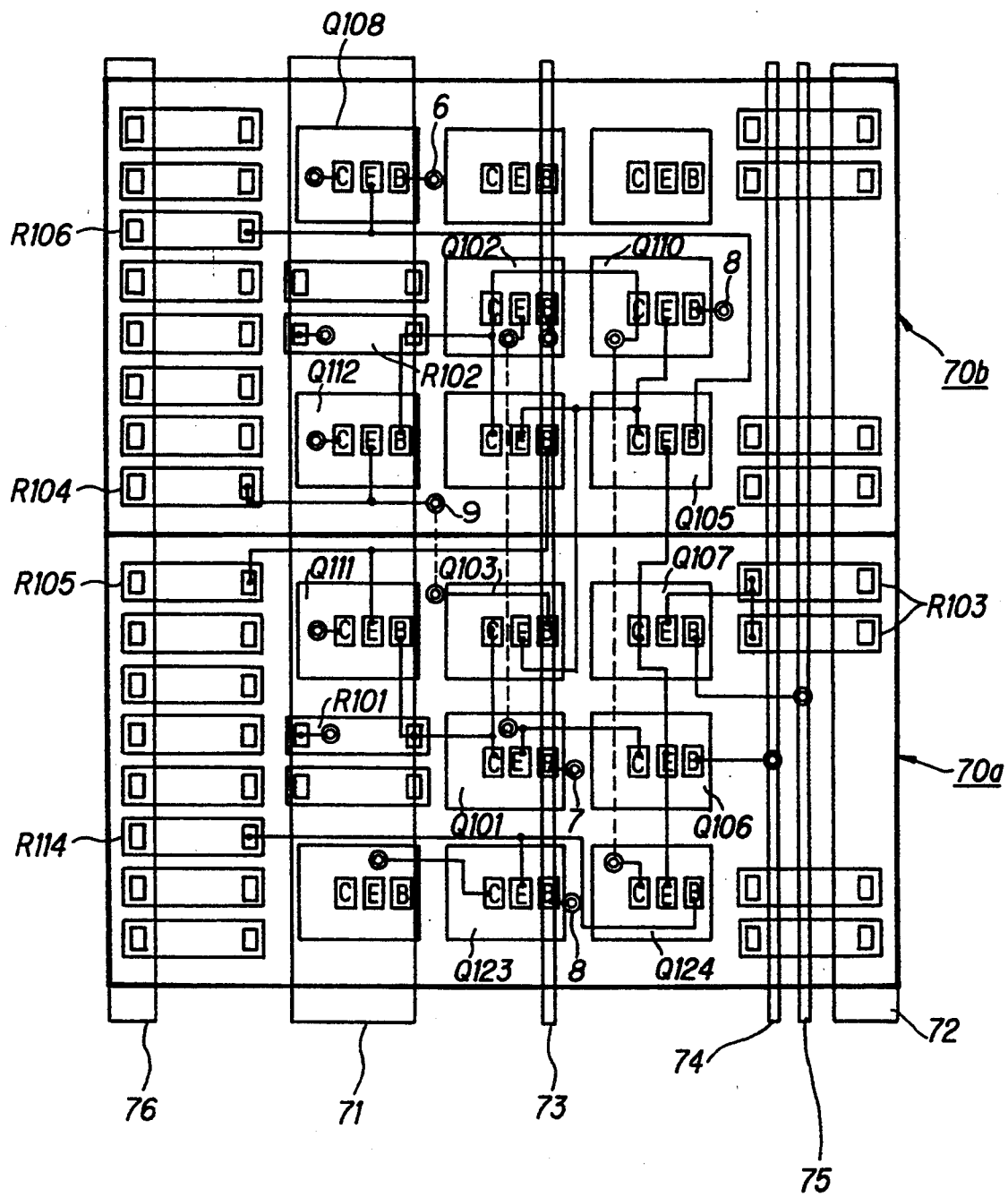
FIG. 12 is a plan view showing a master slice type LSI pattern of the first preferred embodiment shown in FIG. 7.

FIG. 11 shows a substrate using unit cells 78a and 78b each corresponding to the unit cell 50. FIG. 12 shows a substrate in which the required devices are connected each other. In FIG. 12, like parts are indicated by like reference symbols as used in FIG. 9.

In FIG. 11, transistors T701, T702, T704, T705, T706, T707 and T708 correspond to the transistors Q124, Q123, Q106, Q107, Q101, Q103 and Q111 in FIG. 12, respectively. A pair of general resistors P703 and P704, which are connected in parallel, correspond to the resistor R103, and general resistors P709, P714 and P706 correspond to the resistors R114, R105 and R101, respectively.

The transistors Q105, Q104, Q112, Q110, Q102 and Q108 in FIG. 12 correspond to transistors T721, T722, T723, T724, T725 and T728 of FIG. 11, respectively. The general resistors R114, R116 and R112 correspond to resistors P726, P732 and P725, and the level-shift resistor R208 corresponds to a resistor P935, respectively.

The latch circuit of the first preferred embodiment occupies an area of 1,680×2=3,360 (μm²) on the substrate. Therefore, the latch circuit of the first preferred embodiment can reduce a total area 12.5% relative to 1,920×2=3,840 (μm²) of the conventional latch circuit shown in FIG. 1.

Figure 13:
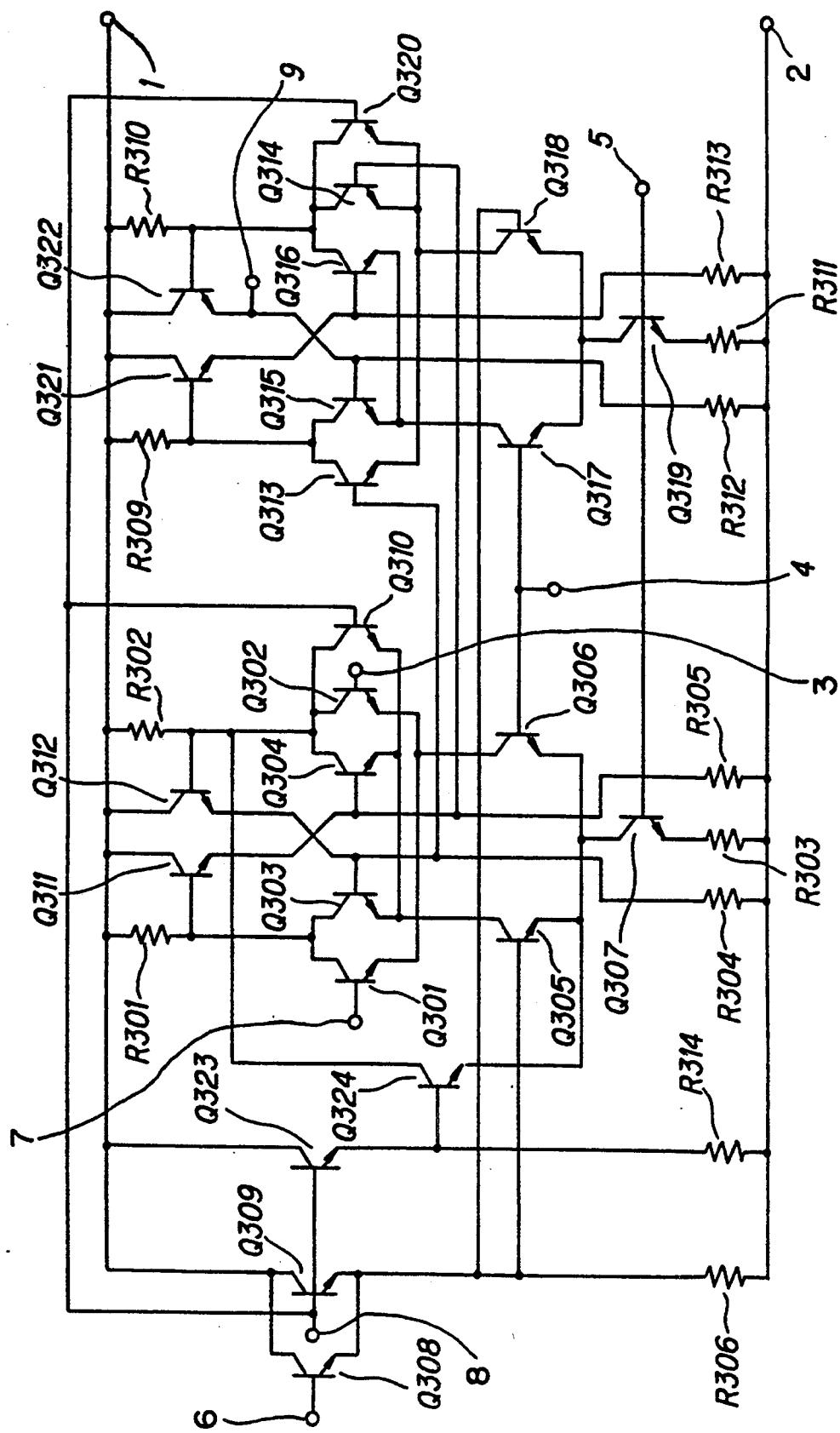
FIG. 13 is a circuit diagram illustrating a master-slave D flip-flop circuit of a second preferred embodiment according to the invention.

FIG. 13 shows a master-slave type D flip-flop circuit using the latch circuit shown in FIG. 9 at the master side thereof. The flip-flop circuit includes twenty-four transistors Q301 to Q324, twelve resistors R301 to R306 and R309 to R314, first and second power supply terminals 1 and 2, first, second and third reference voltage terminals 3 to 5, a strobe signal terminal 6, a data signal terminal 7, a reset signal terminal 8 and an output terminal 9.

In this circuit, the transistor Q309 is connected at a base to the reset signal terminal 8, and at a collector and an emitter, to an collector and a emitter of the transistor Q308, respectively.

The flip-flop circuit operates in accordance with the truth table shown in FIG. 7. That is, at the master side (left side), when a strobe signal of high level is supplied thereto, the master circuit is in a latch mode in the same manner as the latch circuit shown in FIG. 9. When a strobe signal of low level is supplied thereto, the master circuit becomes in a data-through mode.

On the other hand, at the slave side (right side), the slave circuit is in a latch mode when a strobe signal of low level is supplied thereto. The slave circuit becomes in a data through mode when a strobe signal of high level is supplied thereto. Therefore, the slave side circuit is in the data through mode when the reset signal terminal 8 is high.

When the reset signal terminal 8 is low, the transistor Q324 is invariably off. Therefore, when the clock signal rises up, a signal at the data signal terminal 7 is entrapped into the circuit in the same manner as a general master-slave type D flip-flop circuit.

On the other hand, when the reset signal terminal 8 is high, a reset operation is carried out at the master side in the same manner as the latch circuit shown in FIG. 9. That is, when the reset signal terminal 8 is high, a low level signal is supplied to the base of the transistor Q303 and a high level signal is supplied to the base of the transistor Q304.

At this time, the transistor Q309 is supplied at the base with a high level signal in the slave side circuit, so that the slave circuit becomes in the data through mode. Therefore, constant current "I" generated by the transistor Q318 and the resistor R311 flows through a path of the transistors Q318 and Q314 and the resistor R310, so that the output terminal 9 becomes low. In this condition, when the reset signal terminal 8 becomes low, the slave side circuit becomes in a latch mode. As a result, the output terminal 9 is latched to be low by the transistors Q315 and Q316.

The flip-flop circuit may be fabricated as a master slice LSI by using three cells 50 shown in FIG. 10. FIG. 14 shows a substrate pattern for fabricating the flip-flop circuit, in which three unit cells 70a, 70b and 70c each corresponding to the unit cell 50 are used.

According to the second preferred embodiment, in the same manner as the first preferred embodiment, the flip-flop circuit of the second preferred embodiment occupies an area 12.5% smaller than that of the conventional flip-flop circuit shown in FIG. 7.

Although the invention has been described with respect to specific embodiment for complete and clear disclosure, the appended claims are not to be thus limited but are to be constructed as embodying all modification and alternative constructions that may be occur to one skilled in the art which fairly fall within the basic teaching herein set forth.

What is claimed is:

1. A latch circuit, comprising:
   a first ECL (emitter coupled logic) circuit for supplying positive (high) and negative (low) signals in accordance with a data signal supplied thereto;
   a second ECL circuit including a flip-flop circuit for shifting levels of said positive and negative signals and latching said data signal by a positive feedback of said level shifted signals, and a first current path means arranged in parallel to said flip-flop circuit;
   a third ECL circuit for causing said first and second ECL circuits to be active by switching a drive current to be supplied to said first and second ECL circuits in accordance with a strobe signal supplied thereto to control said second ECL circuit;
   first switching means for switching said drive current from said second ECL circuit to said first ECL circuit in accordance with a control signal; and
   a second current path means connected between said second and third ECL circuits, said second current path means including second switching means, connected to said first switching means and said flip-flop circuit, for branching said drive current flowing through said first current path means and supplying a branched current to said second current path means in accordance with said control signal.

2. A latch circuit, according to claim 1, wherein: said control signal is a reset signal causing said flip-flop circuit to be reset.

3. A latch circuit, according to claim 1, wherein said first ECL circuit comprises a first transistor (Q101) connected at a collector through a first resistor (R101) to a first power supply terminal, wherein a base of the first transistor is supplied with said data signal and a second transistor (Q102) connected at a base to a first reference voltage terminal at a collector through a second resistor (R102) to said first power supply terminal and at an emitter to an emitter of said first transistor.

4. A latch circuit, according to claim 2, wherein:
said first ECL circuit comprises a first transistor (Q101) connected at a collector through a first resistor to a first power supply terminal, wherein a base of the first transistor is supplied with said data signal, and a second transistor (Q102) connected at a base to a first reference voltage terminal, at a collector through a second resistor to said first power supply terminal and at an emitter to an emitter of said first transistor.

5. A latch circuit, according to claim 3, wherein:
said second ECL circuit comprises a third transistor (Q103) connected at a base to said collector of said second transistor (Q102), at a collector to said first power supply terminal and at an emitter through a third resistor (R104) to a second power supply terminal and an output terminal; a fourth transistor (Q104) connected at a base to said collector of said first transistor (Q101), at a collector to said first power supply terminal and at an emitter through a fourth resistor (R103) to said second power supply terminal; a fifth transistor (Q111) connected at a base to said collector of said third transistor and at a collector to said collector of said first transistor; a sixth transistor (Q112) connected at a base to said collector of said fourth transistor, at a collector to said collector of said second transistor and at an emitter to said emitter of said fifth transistor; and a seventh transistor (Q110) connected at a collector to each of said collectors of said second and fourth transistors and at an emitter to each of said emitters of said third and fourth transistors, wherein a base is supplied with said reset signal.

6. A latch circuit, according to claim 4, wherein:
said second ECL circuit comprises a third transistor (Q103) connected at a base to said collector of said second transistor, at a collector to said first power supply terminal and at an emitter through a third resistor (R104) to a second power supply terminal and an output terminal; a fourth transistor (Q104) connected at a base to said collector of said first transistor (Q101), at a collector to said first power supply terminal and at an emitter through a fourth resistor (R103) to said second power supply terminal; a fifth transistor connected at a base to said collector of said third transistor and at a collector to said collector of said first transistor; a sixth transistor (Q112) connected at a base to said collector of said fourth transistor, at a collector to said collector of said second transistor and at an emitter to said emitter of said fifth transistor; and a seventh transistor (Q110) connected at a collector to each of said collectors of said second and fourth transistors and at an emitter to each of said emitters of said third and fourth transistors, wherein a base is supplied with said reset signal.

7. A latch circuit, according to claim 5, wherein:
said third ECL circuit comprises an eighth transistor (Q108) connected at a collector to said first power supply terminal and at an emitter through a fifth resistor (R116) to said second power supply terminal, wherein a base is supplied with said strobe signal; a ninth transistor (Q105) connected at a base to said emitter of said eight transistor and at a base to said emitter of said eighth transistor and at a collector to each of said emitters of said fifth and sixth transistors; a tenth transistor (Q106) connected at a base to a second reference voltage terminal, at a collector to each of said emitters of said first and second transistors and at an emitter to said emitter of said ninth transistors; and a constant current source (Q107) connected at one terminal to each of said ninth and tenth transistors and at the other terminal to said second power supply terminal.

8. A latch circuit, according to claim 6, wherein:
said third ECL circuit comprises an eighth transistor (Q108) connected at a collector to said first power supply terminal and at an emitter through a fifth resistor to said second power supply terminal, wherein a base is supplied with said strobe signal; a ninth transistor (Q105) connected at a base to said emitter of said eight transistor and at a collector to each of said emitters of said fifth and sixth transistors; a tenth transistor (Q106) connected at a base to a second reference voltage terminal, at a collector to each of said emitters of said first and second transistors and at an emitter to said emitter of said ninth transistor; and a constant current source (Q107) connected at one terminal to each of said ninth and tenth transistors and at the other terminal to said second power supply terminal.

9. A latch circuit, according to claim 7, wherein:
said second current path means comprises an eleventh transistor (Q123) connected at a collector to said first power supply terminal and at an emitter through a sixth resistor (R114) to said second power supply terminal, said eleventh transistor being supplied at a base with said reset signal; and a twelfth transistor (Q124) connected at a base to said emitter of said eleventh transistor, at a collector to each of collectors of said second (Q102) and sixth (Q112) transistors and at an emitter to each of said emitters of said ninth (Q105) and tenth (Q106) transistors.

10. A latch circuit, according to claim 8, wherein:
said second current path means comprises an eleventh transistor (Q123) connected at a collector to said first power supply terminal and at an emitter through a sixth resistor (R114) to said second power supply terminal, said eleventh transistor being supplied at a base with said reset signal; and a twelfth transistor (Q124) connected at a base to said emitter of said eleventh transistor, at a collector to each of collectors of said second (Q102) and sixth (Q112) transistors and at an emitter to each of said emitters of said ninth (Q105) and tenth (Q106) transistors.

* * * * *